(12) United States Patent
Hsiao

(10) Patent No.: US 7,436,341 B2
(45) Date of Patent: Oct. 14, 2008

(54) DIGITAL/ANALOG CONVERTING APPARATUS AND DIGITAL/ANALOG CONVERTER THEREOF

(75) Inventor: Ming-Jun Hsiao, Taichung (TW)

(73) Assignee: Alpha Imaging Technology Corp., Hsinchu County (TW)

( * ) Notice: Subject to any disclaimer, the term of this patent is extended or adjusted under 35 U.S.C. 154(b) by 75 days.

(21) Appl. No.: 11/555,726

(22) Filed: Nov. 2, 2006

(65) Prior Publication Data

US 2007/0120716 A1 May 31, 2007

(30) Foreign Application Priority Data

Nov. 29, 2005 (TW) ................. 94141958 A

(51) Int. Cl.
 *H03M 1/66* (2006.01)
(52) U.S. Cl. .................. 341/150; 341/144; 341/172
(58) Field of Classification Search ............... 341/150, 341/143, 144, 175, 172
See application file for complete search history.

(56) References Cited

U.S. PATENT DOCUMENTS 5,162,801 A * 11/1992 Powell et al. ............ 341/150
5,696,509 A * 12/1997 Maejima ................. 341/150
5,892,473 A *  4/1999 Shin ...................... 341/150
5,990,819 A * 11/1999 Fujimori ................. 341/150
6,011,433 A *  1/2000 Nairn ..................... 330/2
6,147,551 A * 11/2000 Hong ..................... 327/554
6,169,509 B1 *  1/2001 Abe ...................... 341/150
6,288,669 B1 *  9/2001 Gata ..................... 341/172
6,437,720 B1 *  8/2002 Yin et al. ................ 341/150
6,522,277 B2 *  2/2003 Fujimori et al. .......... 341/144
6,670,902 B1 * 12/2003 Melanson et al. ......... 341/143
6,693,574 B2 *  2/2004 Yamamura ............... 341/150

* cited by examiner

*Primary Examiner*—Jean B Jeanglaude
(74) *Attorney, Agent, or Firm*—Thomas, Kayden, Horstemeyer & Risley

(57) ABSTRACT

A digital/analog converting apparatus and digital/analog converter are provided. The digital/analog converter includes an operational amplifier, a first filter, a first switch, a second filter, a number of conversion units and a second switch. The operational amplifier has an output terminal, an inverse-phase input terminal and a non-inverse-phase input terminal coupled to a reference voltage. The first filter is coupled between the output terminal and the inverse-phase input terminal. The second filter is coupled between the output terminal via the first switch and the inverse-phase input terminal. Each of the conversion units includes a capacitor. The second switch is coupled between the inverse-phase input terminal and the conversion units, and the conversion units are connected in parallel between the second switch and the output terminal.

25 Claims, 10 Drawing Sheets

| Binary value | s | z3 | z2 | z1 |
|---|---|---|---|---|
| +3 | 1 | 0 | 0 | 0 |
| +2 | 1 | 0 | 0 | 1 |
| +1 | 1 | 0 | 1 | 1 |
| 0 | 0/1 | 1 | 1 | 1 |
| -1 | 0 | 0 | 1 | 1 |
| -2 | 0 | 0 | 0 | 1 |
| -3 | 0 | 0 | 0 | 0 |

DIGITAL/ANALOG CONVERTING APPARATUS AND DIGITAL/ANALOG CONVERTER THEREOF

This application claims the benefit of Taiwan application Serial No. 94141958, filed Nov. 29, 2005, the subject matter of which is incorporated herein by reference.

BACKGROUND OF THE INVENTION

1. Field of the Invention

The invention relates in general to a digital/analog converting apparatus and digital/analog converter thereof, and more particularly to a digital/analog converting apparatus using a smaller number of conversion units and digital/analog converter thereof.

2. Description of the Related Art

Referring to FIG. 1, a structure diagram of a digital/analog converting apparatus is shown. A digital/analog converting apparatus 100 includes a binary to thermometer code unit 110, a dynamic element matching unit 120, a digital/analog converter 130 and a low-pass filter 140.

The binary to thermometer code unit 110 is for receiving and converting a K-bit digital signal Di to a N-bit digital signal Dn, wherein N is generally equal to $2^{(K-1)}$. The dynamic element matching unit 120 is for reducing the affect of the element-value deviation on the digital signal Dn and accordingly outputting the digital signal Dn to the digital/analog converter 130. The digital/analog converter 130 converts the digital signal Dn to an analog signal A0 and outputs the signal A0 to the low-pass filter 140 to generate an analog signal Al.

Referring to FIG. 2, a circuit diagram of a direct-charge-transfer digital/analog converter disclosed by Ichiro Fujimori in U.S. Pat. No. 5,990,819 is shown. A digital/analog converter 200 includes conversion units E1 to Ei, switches SW01 and SW02, a capacitor Ch0 and an operational amplifier O1.

The conversion unit E1 includes a capacitor CD1, and switches 201~203. The switch 201 is coupled between the capacitor CD1 and the output terminal OUT. The switch 202 is coupled between the capacitor CD1 and a high voltage Vr+. The switch 203 is coupled between the capacitor CD1 and a low voltage Vr−. The conversion unit Ei includes a capacitor CDi and switches 211~213. The switch 211 is coupled between the capacitor CDi and the output terminal OUT. The switch 212 is coupled between the capacitor CDi and the high voltage Vr+. The switch 213 is coupled between the capacitor CDi and the low voltage Vr−.

The conversion units E1 to Ei are controlled by signals $\phi1$ and $\phi2$. The signal $\phi1$ is complementary to the signal $\phi2$. The conversion unit Ei is taken as an example in the following description. When the signal $\phi1$ is enabled, the switch SW1 is turned on, and the capacitor Ci is charged by a voltage (Vr+-Vref) or (Vr−-Vref) according to a value di. When the signal $\phi2$ is enabled, the capacitors C1~Ci share charges to achieve the purpose of digital-to-analog conversion and provide the voltage to the capacitor Ch after the conversion to complete first-order low-pass filtering.

However, in order that the digital/analog converter 130 can output an analog signal with N voltage levels, the digital/analog converter 130 needs to have N conversion units. When the signal OUT is required to be more accurate, the number of the conversion units has to be increased. Besides, as the number N of conversion units is increased, the circuit complication of the binary to thermometer code unit and the dynamic element matching unit will also be largely increased as well as the cost and circuit size of the digital/analog converting apparatus.

SUMMARY OF THE INVENTION

It is therefore an object of the invention to provide a digital/analog converter. The same accuracy of an analog signal can be achieved by using a smaller number of conversion units. Therefore, circuit size and complication of the digital/analog converting apparatus can also be reduced.

The invention achieves the above-identified object by providing a digital/analog converter for converting a digital signal to an analog signal. The digital/analog converter includes an operational amplifier, a first filter, a first switch, a second filter, a number of conversion units and a second switch. The operational amplifier has an output terminal, an inverse-phase input terminal and a non-inverse-phase input terminal, and the non-inverse-phase input terminal is coupled to a reference voltage. The first filter has one end coupled to the output terminal and the other end coupled to the inverse-phase input terminal. The second filter has one end coupled to the output terminal via the first switch and the other end coupled to the inverse-phase input terminal. Each of the conversion units includes a capacitor having a first end and a second end. The second switch is coupled between the inverse-phase input terminal and the conversion units, and the conversion units are connected in parallel between the second switch and the output terminal. In a first duration, the first switch is turned on, the second switch is turned off, the capacitor in each of the conversion units is charged to a corresponding voltage under control of a first digital signal and a second digital signal, the first digital signal is corresponding to polarity of the digital signal and the second digital is corresponding to a bit value of the digital signal. In a second duration, the first switch is turned off, the second switch is turned on, the second ends of the capacitors are coupled to the inverse-phase input terminal via the second switch, and the first ends of the capacitors are coupled to the output terminal to generate the analog signal.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 11:
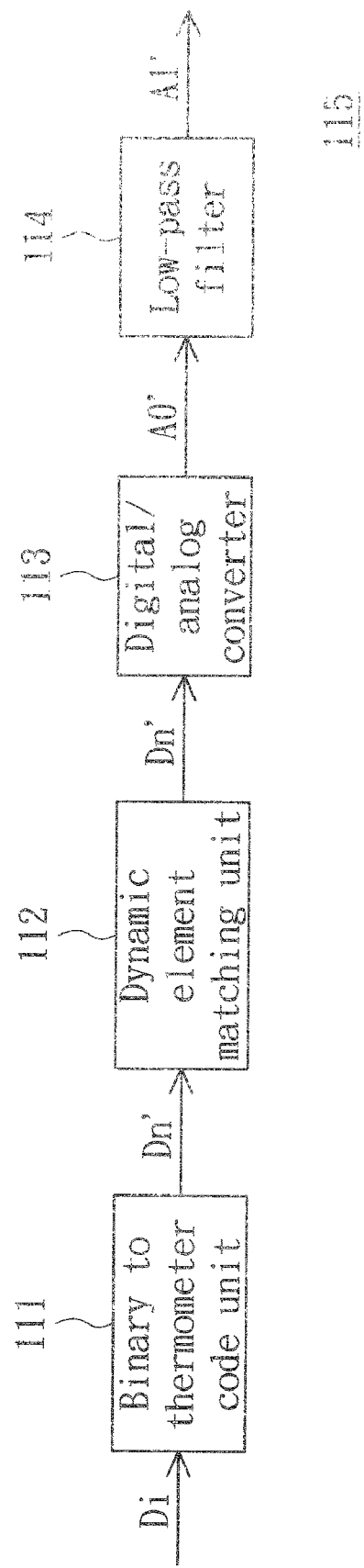
FIG. 11 is a block diagram of a digital/analog converting apparatus according to the invention.

Referring to FIG. 11, a block diagram of a digital/analog converting apparatus according to the invention is shown. A digital/analog converting apparatus 115 includes a binary to thermometer code unit 111, a dynamic element matching unit 112, a digital/analog converter 113 and a low-pass filter 114. The binary to thermometer code unit 111 is for receiving and converting a K-bit digital signal Di to a N-bit digital signal Dn'. The dynamic element matching unit 112 is for reducing the affect of element-value deviation on the signal Dn' and accordingly outputting the digital signal Dn' to the digital/analog converter 113. The digital/analog converter 113 converts the digital signal Dn to an analog signal A0' and outputs the signal A0' to the low-pass filter 114 to generate an analog signal A1'.

In the following description, a number of embodiments for digital/analog converters according to the concept of the invention are provided.

Embodiment One

Figure 1:
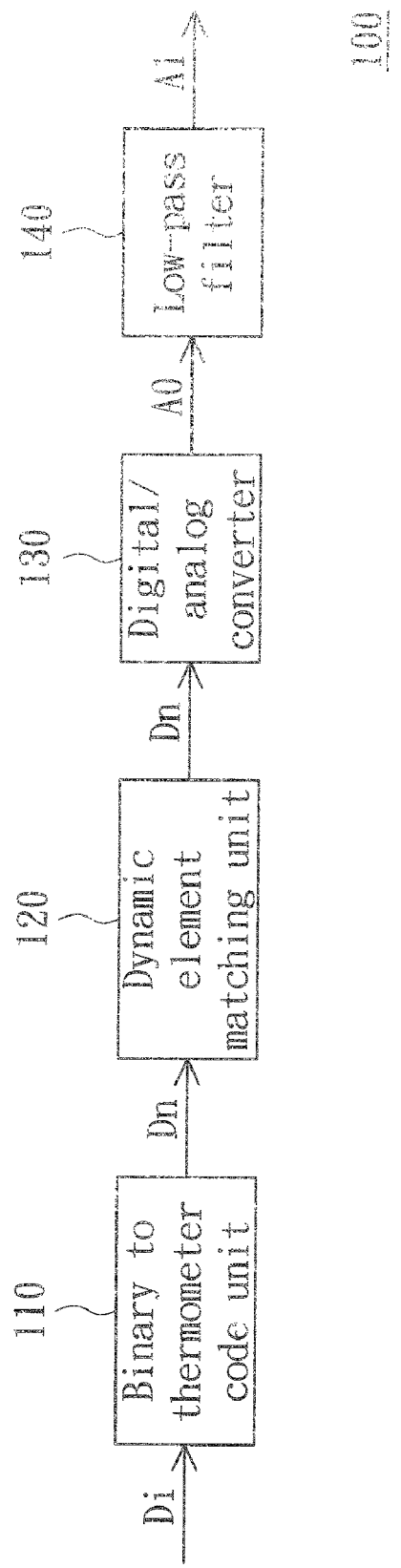
FIG. 1 is a structure diagram of a digital/analog converting apparatus.
Figure 2:
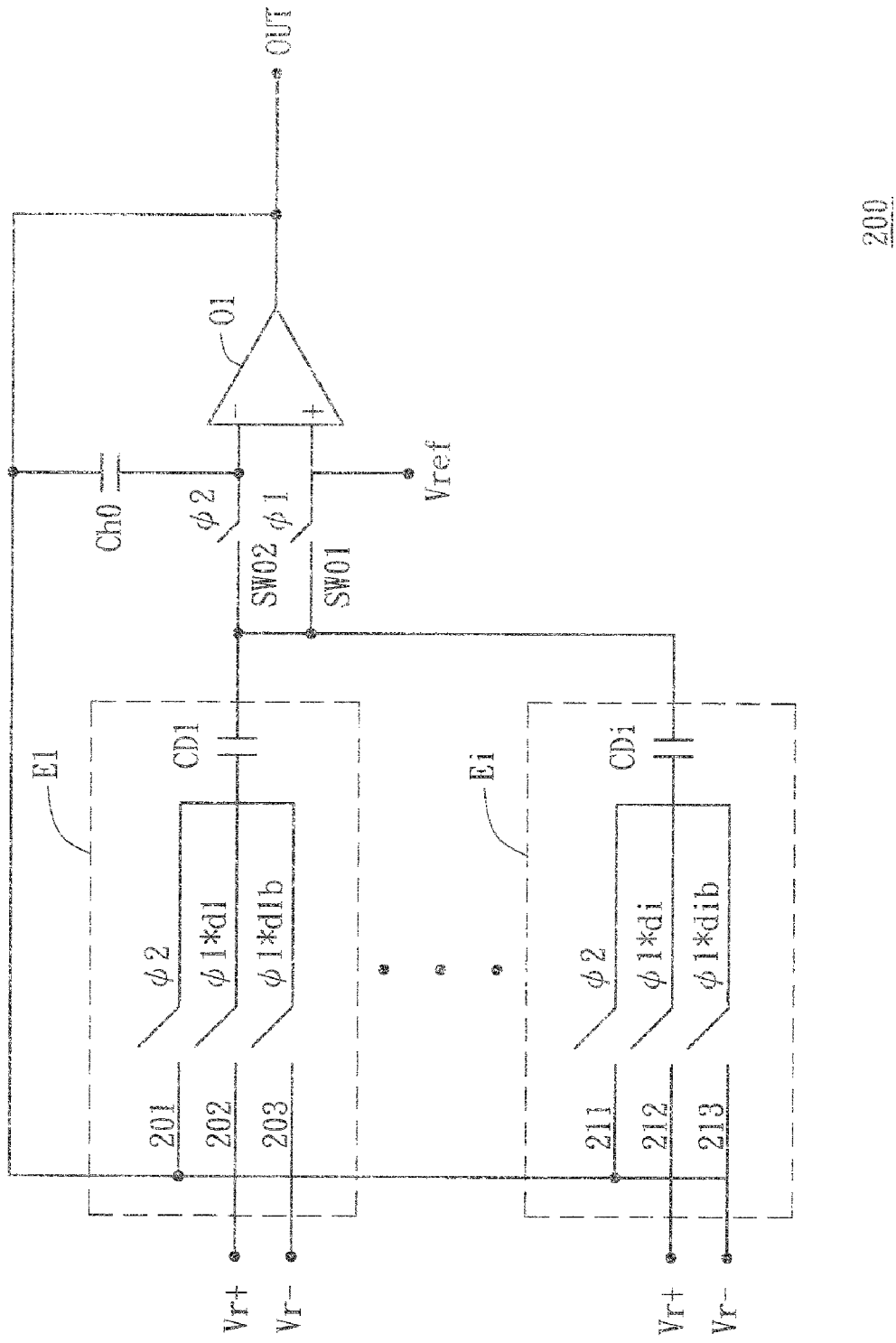
FIG. 2 (Prior Art) is a circuit diagram of a direct-charge digital/analog converter disclosed by Ichiro Fujimori in U.S. Pat. No. 5,990,819.
Figure 3:
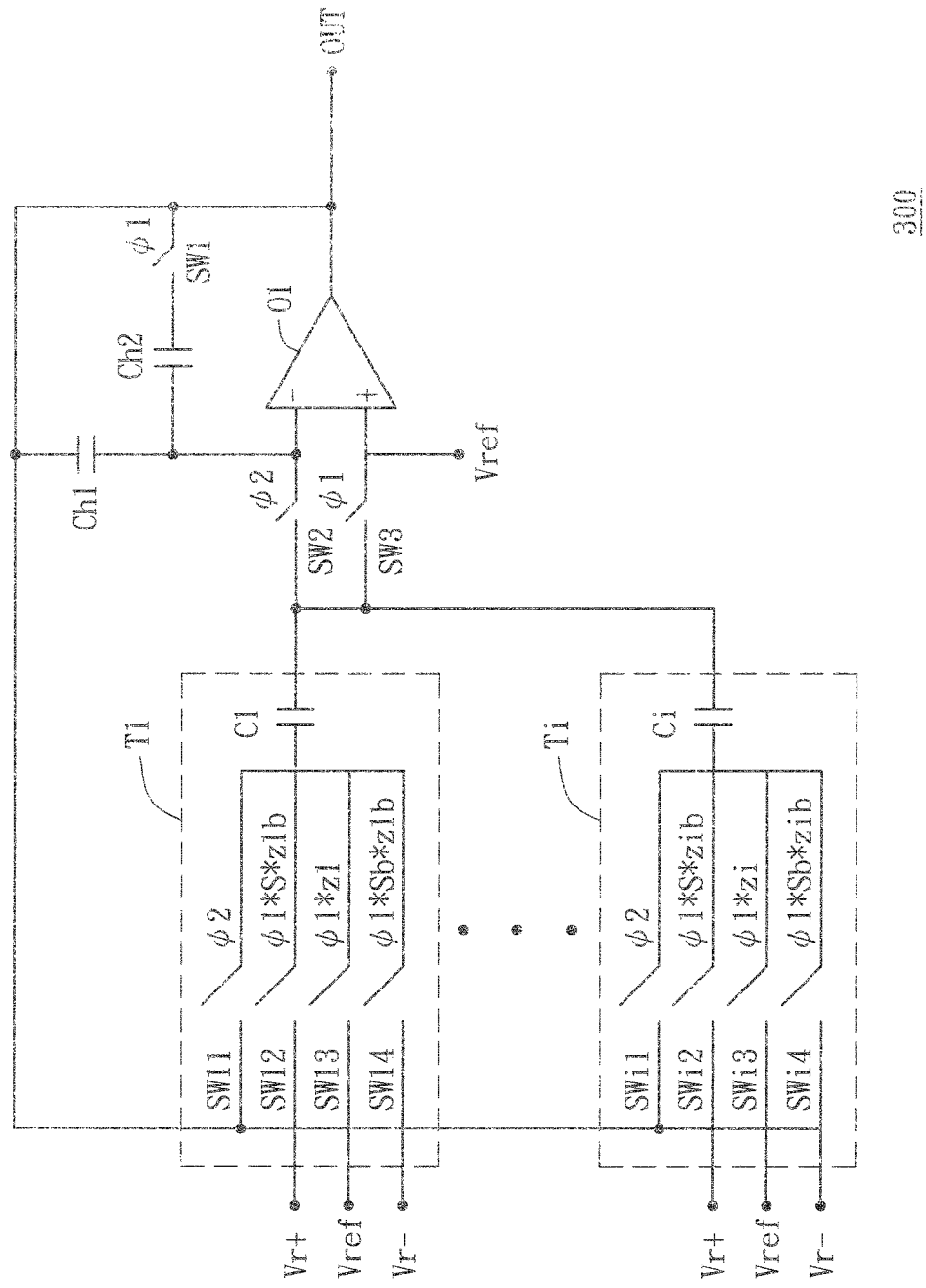
FIG. 3 is a circuit diagram of a digital/analog converter according to a first embodiment of the invention.

Referring to FIG. 3, a circuit diagram of a digital/analog converter according to a first embodiment of the invention is shown. A digital/analog converter 300 converts a digital signal Dn' to an analog signal A0'. The digital/analog converter 300 includes a first filter Ch1, a second filter Ch2, switches SW1~SW3, an operational amplifier O1, and conversion units T1 to Ti. The bit value and polarity of the digital signal Dn' is inputted to each of the conversion units T1 to Ti. The first filter Ch1 and the second filter Ch2 are exemplified as capacitors in the description.

The operational amplifier O1 has an output terminal OUT, an inverse-phase input terminal and a non-inverse-phase input terminal and the non-inverse-phase input terminal is coupled to a reference voltage Vref. The first filter Ch1 has one end coupled to the output terminal OUT and the other end coupled to the inverse-phase input terminal of the operational amplifier O1. The second filter Ch2 has one end coupled to the output terminal OUT via the switch SW1 and the other end coupled to the inverse-phase input terminal of the operational amplifier O1. The conversion units T1 to Ti respectively include capacitors C1 to Ci. Each of the capacitors C1 to Ci has a first end and a second end. The switch SW2 is coupled to the inverse-phase input terminal of the operational amplifier O1 and the conversion units T1 to Ti.

Figures 4, 5:
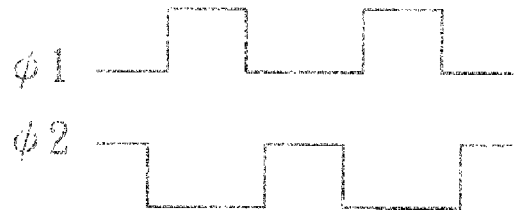
FIG. 4 is a waveform diagram of the clock signal required by the digital/analog converter in FIG. 3.
FIG. 5 is an exemplified diagram of the digital signal in binary conversion according to the concept of the invention.

Referring to FIG. 4, a waveform diagram of the clock signal required by the digital/analog converter 300 is shown. A clock signal $\phi1$ is used for controlling the switches SW1 and SW3 to be on/off. The clock signal $\phi2$ is used for controlling the switches SW2, SW11 to SWi1 to be on/off. The clock signal $\phi1$ is complementary to the clock signal $\phi2$. In a first duration, the clock signal $\phi1$ is enabled to have a high voltage for instance, and in a second duration, the clock signal $\phi2$ is enabled to have a high voltage for instance. The digital/analog converter 300 can perform the above-mentioned operations in the first duration and in the second duration under control of the clock signal $\phi1$ and $\phi2$.

Referring to FIG. 5, an exemplified diagram of the digital signal in binary conversion according to the concept of the invention is shown. The first digital signal S is corresponding to the polarity of the digital signal Dn'. When the digital signal Dn' has a positive polarity, the first digital signal S is 1 while when the digital signal Dn' has a negative polarity, the first digital signal S is 0. The second signals Z1, Z2 and Z3 are corresponding to other bits of the digital signal Dn'. Supposed that the binary value is +1, the second digital signal Z3 is 0, the second digital signals Z1 and Z2 are 1, the first digital signal S is 1 and the absolute value of the digital signal Dn' is j, the digital signal Dn' has j bits of value 0 except for the first digital signal S of value 1.

In the embodiment, the digital/analog converter 300 can output an analog signal with 7 voltage levels by using only 3 conversion units. According to the exemplified diagram of FIG. 5, in terms of a prior-art skill, it needs to have 7 conversion units to output an analog signal with 7 voltage levels. Therefore, the advantage of the invention can be realized from this.

Referring to FIG. 3 again, the digital/analog converter 300 further includes a switch SW3 coupled between the second ends of the capacitors C1 to Ci and the non-inverse-phase input terminal. The switch SW3 is turned on in the first duration such that the second ends of the capacitors C1 to Ci are coupled to the non-inverse-phase input terminal to receive the reference voltage Vref. The conversion unit T1 includes switches SW11 to SW14 and a capacitor C1.

In the following description, the conversion unit Ti is taken as an example for illustration. The conversion unit Ti includes conversion switches SWi1 to SWi4 and a capacitor Ci. The conversion switch SWi1 is controlled by a clock signal $\phi2$ and coupled between the output terminal OUT and the first end of the capacitor Ci. The conversion switch SWi2 is controlled by a signal ($\phi1*S*zib$) and coupled between the high voltage Vr+ and the first end of the capacitor Ci. The conversion switch SWi3 is controlled by a signal ($\phi1*zi$) and coupled between the reference voltage Vref and the first end of the capacitor Ci. The conversion switch SWi4 is controlled by a signal ($\phi1*Sb*zib$) and coupled between the low voltage Vr− and the first end of the capacitor Ci. The signal Sb has an inverse phase to the first digital signal S and the signal zib has an inverse phase to the second digital signal zi.

In the first duration, the clock signal $\phi1$ is enabled. When the first digital signal S is enabled or disenabled, such as 0 or 1, and the second digital signal zi is enabled, the conversion switch SWi3 is turned on such that one end of the capacitor Ci has the reference voltage Vref and the capacitor Ci has a storage voltage Vi equal to 0V.

In the second duration, the clock signal $\phi1$ is enabled. When the first digital signal S is disenabled, such as 0, and the second digital signal zi is disenabled, such as 0, the conversion switch SWi4 is turned on such that one end of the capacitor Ci has the low voltage Vr− and the capacitor Ci has the storage voltage Vi equal to (Vr−−Vref).

In the first duration, the clock signal $\phi1$ is enabled. When the first digital signal S is enabled, such as 1, and the second digital signal zi is disenabled, such as 0, the conversion switch SWi2 is turned on such that one end of the capacitor Ci has the high voltage Vr+ and the capacitor Ci has the storage voltage Vi equal to (Vr+−Vref).

In the second duration, the clock signal $\phi2$ is enabled, such as 1, and the switch SW2 and the conversion switch SWi1 are turned on. The second ends of the capacitors C1 to Ci are coupled to the inverse-phase input terminal of the operational amplifier O1 and the first ends of the capacitors C1 to Ci are coupled to the output terminal OUT respectively through the conversion switches SW11 to SWi1. At the time, the capacitors C1 to Ci share their charges. Supposed the corresponding voltages stored in the capacitors C1 to Ci are Vr1 to Vri, the following equation can be obtained $$C1*Vr1+\ldots+Ci*Vri=A0'*(C1+\ldots+Ci);$$

From this equation, the analog signal A0' can be obtained.

In the first duration, the first filter Ch1 stores a value of the analog signal A in the previous period. When the switch SW1 is turned on, the first filter Ch1 and the second filter Ch2 have charge sharing to provide function of a first-order low-pass filter. Supposed that the first filter Ch1 is K1 times the capacitance of the second filter Ch2, the transfer function of the low-pass filter operated in divergent time is $K1/[(1+K1)-Z^{-1}]$.

In the second duration, the capacitors C1 to Ci have charge sharing with the first filter Ch1 and the transfer function of the low-pass filter operated in divergent time is $K2/[(1+K2)-Z^{-1}]$. The value K2 is as follows:

$$K2=(C1+\ldots+Ci)/Ch1.$$

Therefore, the total transfer function is:

$$K1*K2/(((1+K1)-Z^{-1})((1+K2)-Z^{-1})).$$

The function of a second-order filter can be achieved according to the above equation.

EXAMPLE TWO

Figure 6:
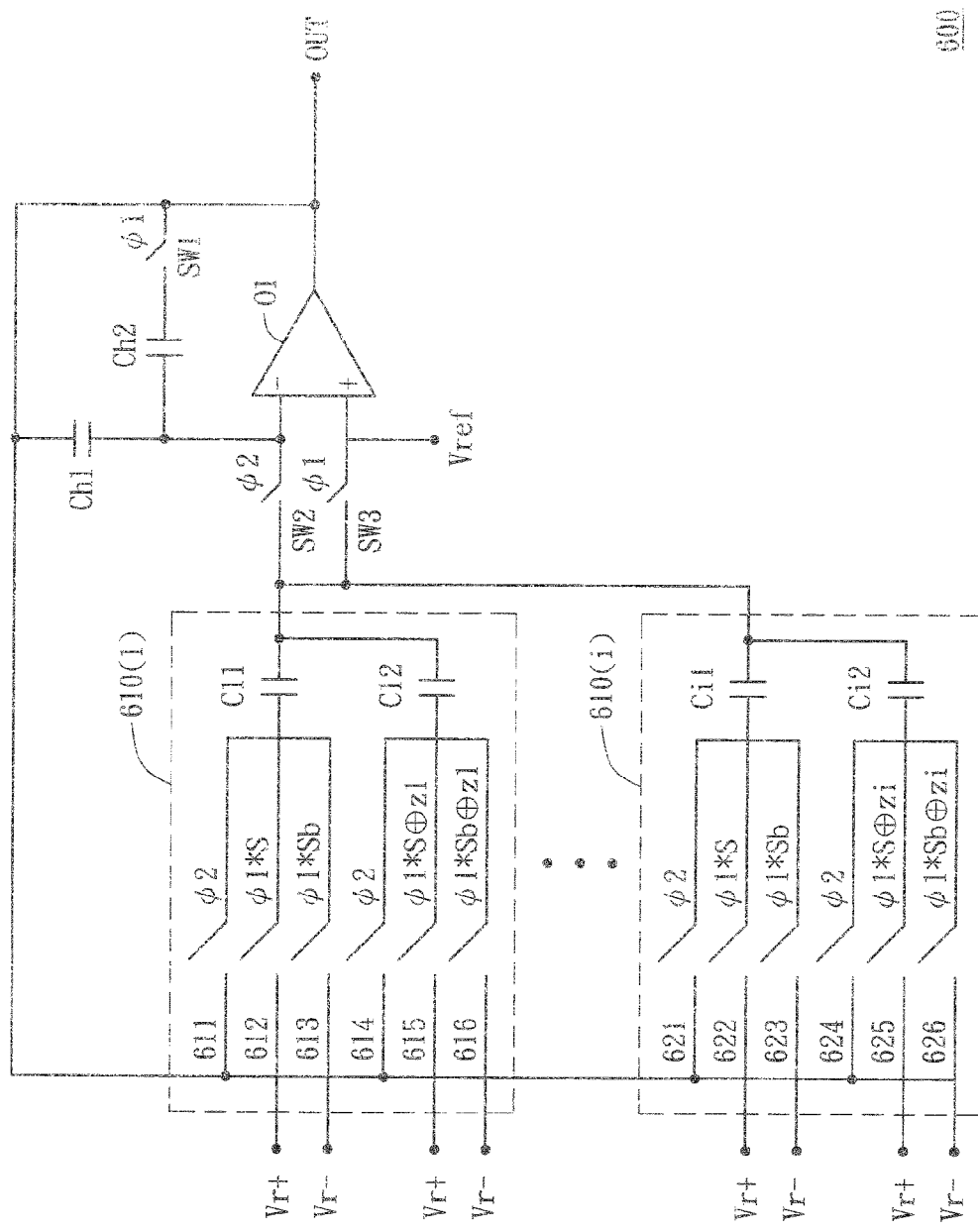
FIG. 6 is a circuit diagram of a digital/analog converter according to a second embodiment of the invention.

Referring to FIG. 6, a circuit diagram of a digital/analog converter according to a second embodiment of the invention is shown. A digital/analog converter 600 is only different in structure of the conversion units from the digital/analog converter 300. The digital/analog converter 600 includes conversion units 610(1) to 610(i).

The conversion unit 610(1) includes capacitors C11 and C12 and conversion switches 611~616. The conversion unit 610(i) includes capacitors Ci1 and Ci2 and conversion switches 621~626. In the following description, the conversion unit 610(i) is taken as an example for illustration.

The conversion switch 621 is controlled by the clock signal φ2, coupled to the output terminal OUT and the first end of the capacitor Ci1, and turned on in the second duration. The conversion switch 622 is controlled by a signal (φ1*S) and coupled between the first end of the capacitor Ci1 and the high voltage Vr+. The conversion switch 623 is controlled by a signal (φ1*Sb) and coupled between the first end of the capacitor Ci1 and the low voltage Vr−. The reference voltage Vref is substantially a mean value of the high voltage Vr+ and the low voltage Vr−.

The second end of the capacitor Ci2 is coupled to the second end of the capacitor Ci1. The conversion switch 624 is controlled by the clock signal φ2 and coupled to the output terminal OUT and the first end of the capacitor Ci2. The conversion switch 625 is controlled by a signal (φ1*S⊕zi) and coupled between the first end of the capacitor Ci2 and the high voltage Vr+. The conversion switch 626 is controlled by a signal (φ1*Sb⊕zi), and coupled between the first end of the capacitor Ci2 and the low voltage Vr−. The signal Sb has an inverse phase to the first digital signal S and the signal zib has an inverse phase to the second digital signal zi.

In the first duration, the switches 622, 623, 625 and 626 are selectively turned on under control of the above-mentioned signals such that the capacitors can be charged to the corresponding voltage. In the embodiment, the capacitors Ci1 and Ci2 have substantially the same capacitance. The operation principle of the digital/analog converter 600 can be obtained by analog from the description of the first embodiment by any one skilled in the related art and any detail is not necessary to be given here.

Embodiment Three

Figure 7:
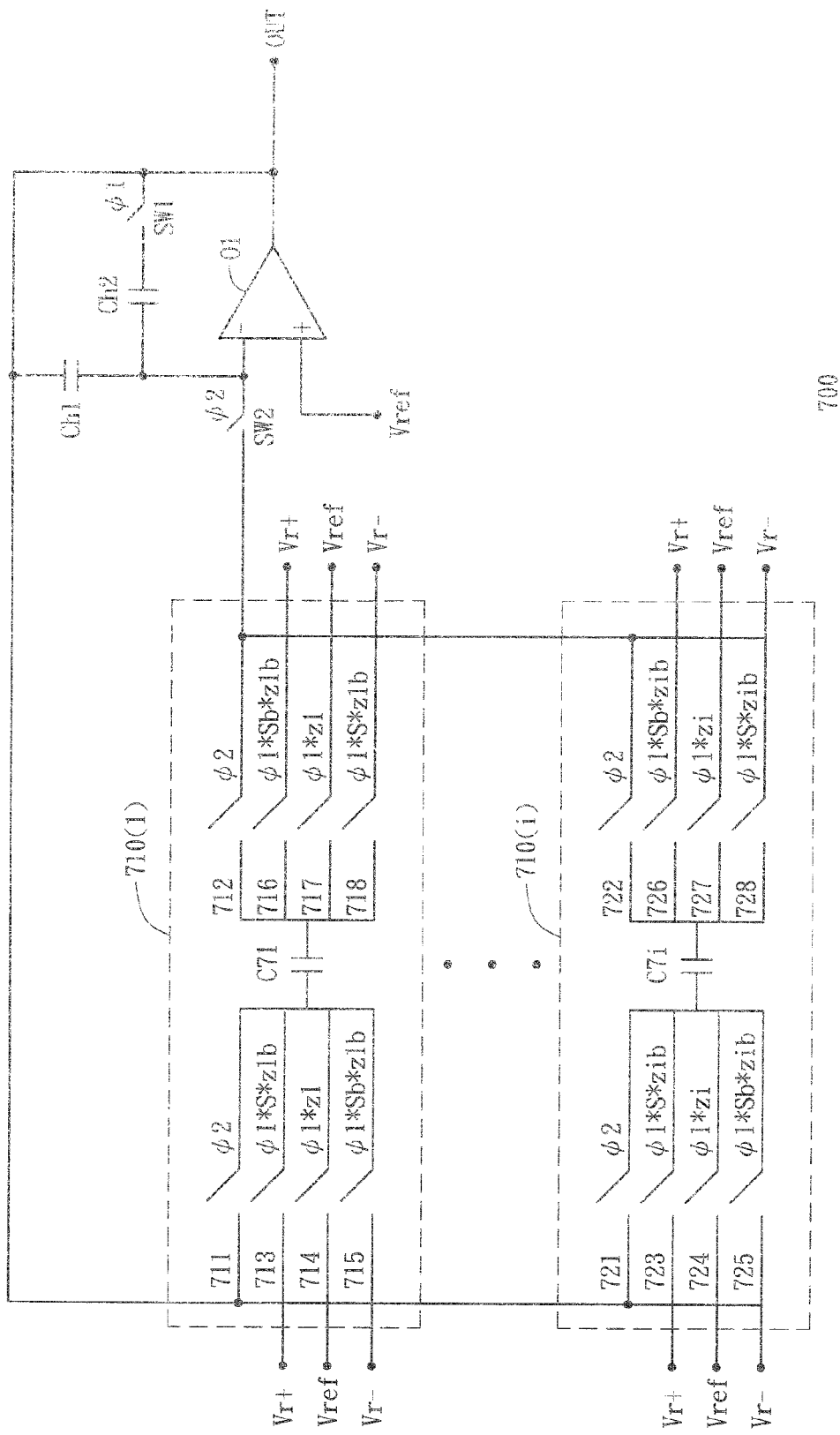
FIG. 7 is a circuit diagram of a digital/analog converter according to a third embodiment of the invention.

Referring to FIG. 7, a circuit diagram of a digital/analog converter according to a third embodiment of the invention is shown. A digital/analog converter 700 does not have the switch SW3 and is different only in the structure of the conversion units as compared to the digital/analog converter 300. The digital/analog converter 700 includes conversion units 710(1) to 710(i).

The conversion unit 710(1) includes a capacitor C71 and conversion switches 711 to 718. The conversion unit 710(i) includes capacitor C7i and conversion switches 721 to 728. In the following description, the conversion unit 710(i) is taken as an example for illustration.

The conversion switch 721 is controlled by the clock signal φ2 and coupled to the output terminal OUT and the first end of the capacitor C7i. The conversion switch 722 is controlled by the clock signal φ2 and coupled to the switch SW2 and the second end of the capacitor C7i. The conversion switches 721 and 722 are turned on in the second duration.

The conversion switch 723 is controlled by the signal (φ1*S*zib) and coupled between the first end of the capacitor C7i and the high voltage Vr+. The conversion switch 724 is controlled by the signal (φ1*zi) and coupled between the first end of the capacitor C7i and the reference voltage Vref. The conversion switch 725 is controlled by the signal (φ1*Sb*zib), and coupled between the first end of the capacitor C7i and the low voltage Vr−.

The conversion switch 726 is controlled by the signal (φ1*Sb*zib), and coupled between the second end of the capacitor C7i and the high voltage Vr+. The conversion switch 727 is controlled by the signal (φ1*zi), and coupled between the second end of the capacitor C7i and the reference voltage Vref. The conversion switch 728 is controlled by the signal (φ1*S*zib), and coupled between the second end of the capacitor C7i and the low voltage Vr−.

In the first duration, the switches 723 to 728 are selectively turned on under control of the above-mentioned signals such that the capacitor C7i can be charged to the corresponding voltage. In the embodiment, the operation principle of the digital/analog converter 700 can be obtained by analog from the description of the first embodiment by any one skilled in the related art and thus any detail is not necessary to be given here.

Embodiment Four

Figure 8:
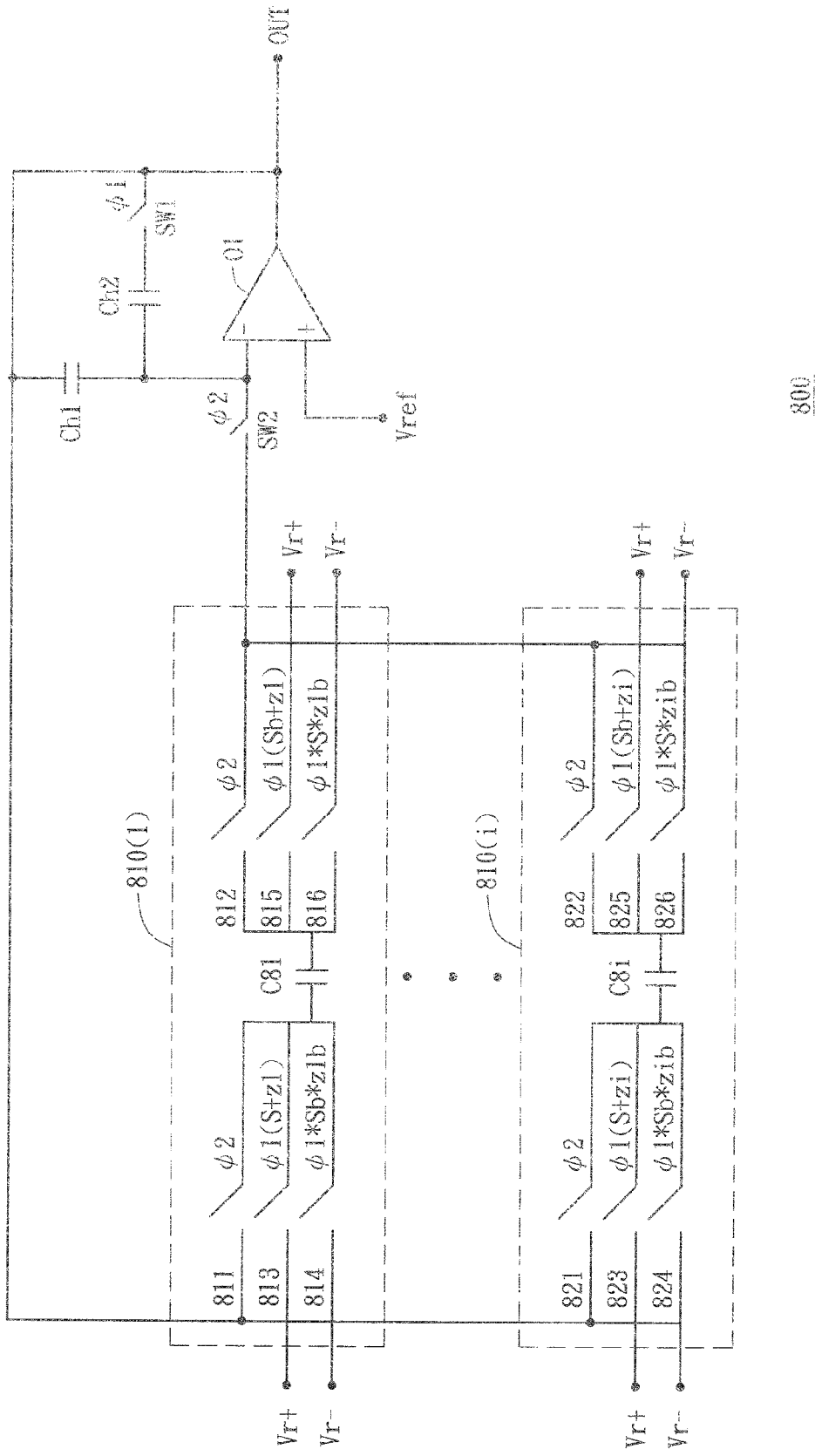
FIG. 8 is a circuit diagram of a digital/analog converter according to the fourth embodiment of the invention.

Referring to FIG. 8, a circuit diagram of a digital/analog converter according to the fourth embodiment of the invention is shown. A digital/analog converter 800 does not have the switch SW3 and is different in the structure of the conversion units as compared to the digital/analog converter 300. The digital/analog converter 800 includes conversion units 810(1) to 810(i).

The conversion unit 810(1) includes a capacitor C81 and conversion switches 811 to 826. The conversion unit 810(i) includes capacitor C8i and conversion switches 822 to 826. In the following description, the conversion unit 810(i) is taken as an example for illustration.

The conversion switch 821 is controlled by the clock signal φ2 and coupled to the output terminal OUT and the first end of the capacitor C8i. The conversion switch 822 is controlled by the clock signal φ2 and coupled to the switch SW2 and the second end of the capacitor C8i. The conversion switches 821 and 822 are turned on in the second duration.

The conversion switch 823 is controlled by the signal ($\phi1^*$(S+zi)), and coupled between the first end of the capacitor C8i and the high voltage Vr+. The conversion switch 824 is controlled by the signal ($\phi1^*$Sb$^*$zib), and coupled between the first end of the capacitor C8i and the low voltage Vr−.

The conversion switch 825 is controlled by the signal ($\phi1^*$(Sb+zi)), and coupled between the second end of the capacitor C8i and the high voltage Vr+. The conversion switch 826 is controlled by the signal ($\phi1^*$Sb$^*$zib) and coupled between the second end of the capacitor C8i and the low voltage Vr−.

In the embodiment, the control signals for the switches 823 to 826 can be altered. For example, the conversion switch 823 can be controlled by the signal ($\phi1^*$S$^*$zib), the conversion switch 824 can be controlled by the signal ($\phi1^*$(Sb+zi)), the conversion switch 825 can be controlled by the signal ($\phi1^*$Sb$^*$zib), and the conversion switch 826 can be controlled by the signal ($\phi1^*$(S+zi)) alternatively. Accordingly, the same effect can be achieved as that by using the above-mentioned signals.

In the first duration, the switches 823 to 826 are selectively turned on under control of the above-mentioned signals such that the capacitor can be charged to the corresponding voltage. In the embodiment, the operation principle of the digital/analog converter 800 can be obtained by analog from the description of the first embodiment by any one skilled in the related art and thus any detail is not necessary to be given here.

Embodiment Five

Figure 9:
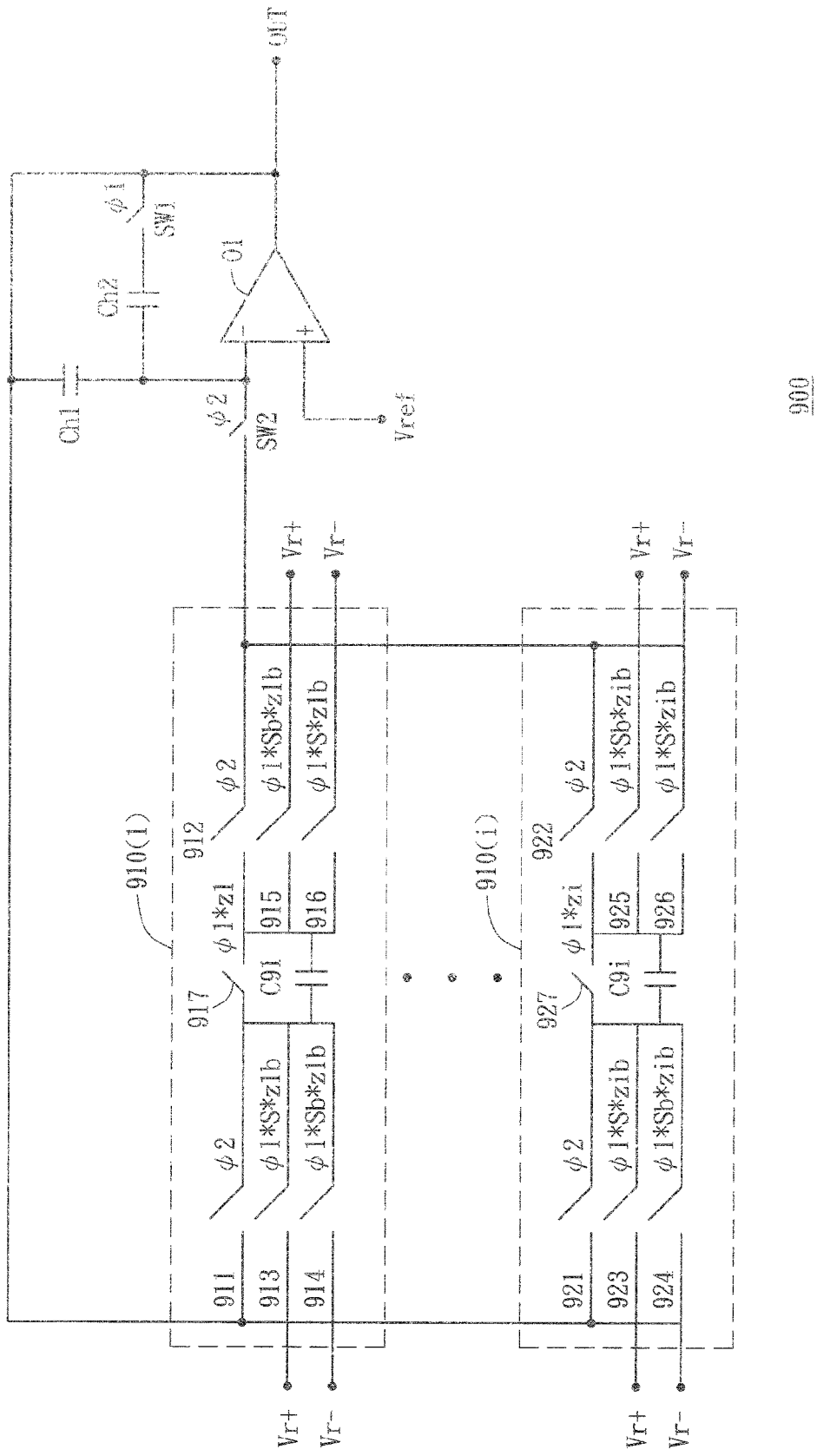
FIG. 9 is a circuit diagram of a digital/analog converter according to a fifth embodiment of the invention.

Referring to FIG. 9, a circuit diagram of a digital/analog converter according to a fifth embodiment of the invention is shown. A digital/analog converter 900 does not have the switch SW3 and is different only in the structure of the conversion units as compared to the digital/analog converter 300. The digital/analog converter 900 includes conversion unit 910(1) to 910(i).

The conversion unit 910(1) includes a capacitor C91 and conversion switches 911 to 917. Take the conversion unit 910(i) as an example. The conversion unit 910(i) includes a capacitor C9i and conversion switches 921 to 927.

The conversion switch 921 is controlled by the clock signal $\phi2$ and coupled to the output terminal OUT and the first end of the capacitor C9i. The conversion switch 922 is controlled by the clock signal $\phi2$ and coupled to the switch SW2 and the second end of the capacitor C9i. The conversion switches 921 and 922 are turned on in the second duration.

The conversion switch 923 is controlled by the signal ($\phi1^*$S$^*$zib) and coupled between the first end of the capacitor C9i and the high voltage Vr+. The conversion switch 924 is controlled by the signal ($\phi1^*$Sb$^*$zib) and coupled between the first end of the capacitor C9i and the low voltage Vr−.

The conversion switch 925 is controlled by the signal ($\phi1^*$Sb$^*$zib), and coupled between the second end of the capacitor C9i and the high voltage Vr+. The conversion switch 926 is controlled by the signal ($\phi1^*$S$^*$zib), and coupled between the second end of the capacitor C9i and the low voltage Vr−. The conversion switch 927 is controlled by the signal ($\phi1^*$zi), and coupled to the two ends of the capacitor C9i.

In the first duration, the switches 923 to 927 are selectively turned on under control of the above-mentioned signals such that the capacitor C9i can be charged to the corresponding voltage. The significant difference of the digital/analog converter 900 in the embodiment from those in other embodiments lies in the switch 927 is used to conduct two ends of the capacitor C9i such that the capacitor C9i can be discharged to a zero voltage in the first duration. In the embodiment, the operation principle of the digital/analog converter 900 can be obtained by analog from the description of the first embodiment by any one skilled in the related art and thus any detail is not necessary to be given here.

Figure 10:
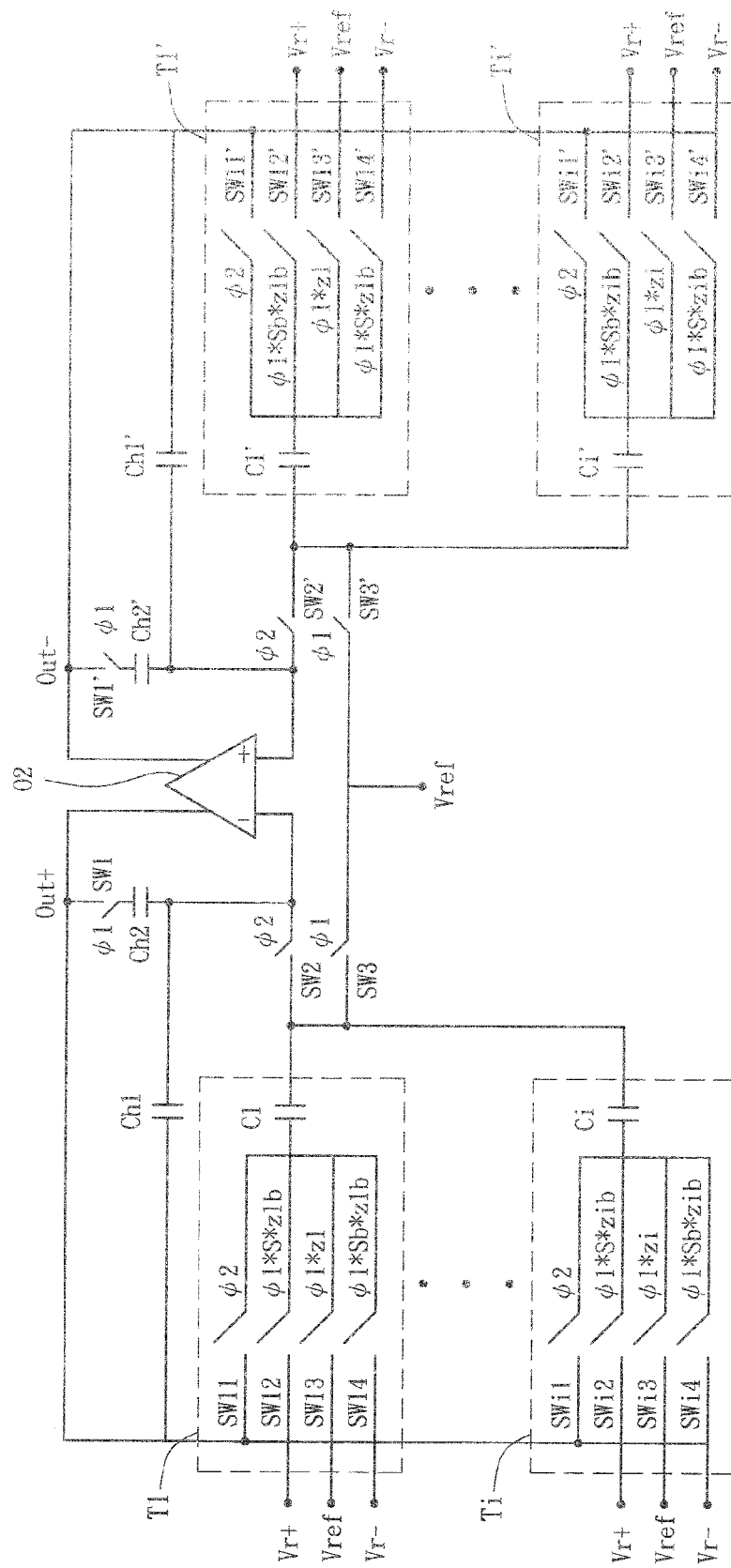
FIG. 10 is a circuit diagram of a fully-differential digital/analog converter according to a preferred embodiment of the invention.

Referring to FIG. 10, a circuit diagram of a fully-differential digital/analog converter according to a preferred embodiment of the invention is shown. A digital/analog converter 390 includes a first capacitor Ch1', a second filter Ch2', switches SW1, SW1', SW2, SW2', SW3 and SW3', an operational amplifier O2, conversion units T1 to Ti and inverse-phase conversion units T1' to Ti'.

The operational amplifier O2 has a non-inverse-phase output terminal OUT+, an inverse-phase output terminal OUT−, an inverse-phase input terminal and a non-inverse-phase input terminal. The first filter Ch1 has one end coupled to the non-inverse-phase output terminal OUT+ and the other end coupled to the inverse-phase input terminal of the operational amplifier O2. The second filter Ch2 has one end coupled to the non-inverse-phase output terminal OUT+ via the switch SW1 and the other end coupled to the inverse-phase input terminal of the operational amplifier O2. The conversion units T1 to Ti respectively include capacitors C1 to Ci. Each of the capacitors C1 to Ci has a first end and a second end. The switch SW2 is coupled to the inverse-phase input terminal of the operational amplifier O2 and the conversion units T1 to Ti. The switch SW3 is coupled between a reference voltage Vref and the conversion units T1 to Ti.

The first filter Ch1' has one end coupled to the inverse-phase output terminal OUT− and the other end coupled to the inverse-phase input terminal of the operational amplifier O2. The second filter Ch2' has one end coupled to the inverse-phase output terminal OUT− via the switch SW1' and the other end coupled to the non-inverse-phase input terminal of the operational amplifier O2. The conversion units T1 to Ti respectively include capacitors C1 to Ci. Each of the capacitors C1 to Ci has a first end and a second end. The switch SW2' is coupled to the on-inverse-phase input terminal of the operational amplifier O2 and the conversion units T1' to Ti'. The switch SW3' is coupled between a reference voltage Vref and the conversion units T1' to Ti'.

The structure of the conversion units T1 to Ti and the control signals for switches are the same as those in FIG. 3 and thus any detail is not necessary to be given here. The conversion unit T1' includes conversion switches SW11' to SW14' and a capacitor C1', and the conversion unit Ti' includes conversion switches SWi1' to SWi4' and a capacitor Ci'.

Take the inverse-phase conversion unit Ti' as an example. The conversion switch SWi1' is controlled by the clock signal $\phi2$ and coupled to the first end of the capacitor Ci' and the inverse-phase output terminal OUT−. The conversion switch SWi2' is controlled by the clock signal ($\phi1^*$Sb$^*$zib) and coupled between the first end of the capacitor Ci' and the high voltage Vr+. The conversion switch SWi3' is controlled by the signal ($\phi1^*$zi) and coupled between the capacitor Ci' and the reference voltage Vref. The conversion switch SWi4' is controlled by the signal ($\phi1^*$S$^*$zib) and coupled between the first end of the capacitor Ci' and the low voltage Vr−.

In the first duration, the switches SWi2' to SWi4' are selectively turned on and the conversion switch SWi1' is turned off. In the second duration, the conversion switch SWi1' is turned on and the conversion switches SWi2' to SWi4' are turned off. The operation principle of the digital/analog converter 390 can be obtained by analog from the description of the first embodiment by any one skilled in the related art and thus any detail is not necessary to be given here. The alternatives and applications of the fully-differential digital/analog converter 390 can be obtained by analog from the above-mentioned digital/analog converter and is also not given any detail here.

The digital/analog converter 113 in FIG. 11 can be replaced by the digital/analog converter 300, 600, 700, 800, 900, and 390 in the above-mentioned embodiments, or any other digital/analog converter obtained by using the concept of the embodiments to simplify the circuit of the digital/analog converting apparatus 115.

The digital/analog converters disclosed in the above-mentioned embodiments of the invention can output an analog signal with N voltage levels by using only ((N−1)/2) conversion units, which is different from the prior-art digital/analog converter using N conversion units to achieve the same effect. The circuit complication of the binary to thermometer code unit and the dynamic element matching unit can be reduced and thus the circuit size and production cost of the digital/analog converting apparatus can be lowered down in the meanwhile the effect of a second-order filter can be achieved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A digital/analog converter for converting an input digital signal to an analog signal comprising:
    an operational amplifier, having an output terminal, an inverse-phase input terminal and a non-inverse-phase input terminal, wherein the non-inverse-phase input terminal is coupled to a reference voltage;
    a first filter, having a first end coupled to the output terminal and a second end coupled to the inverse-phase input terminal;
    a first switch;
    a second filter, having a first end coupled to the output terminal via the first switch and a second end coupled to the inverse-phase input terminal, wherein in a first duration the first switch is turned on and the second switch is turned off; and in a second duration the first switch is turned off and the second switch is turned on;
    a plurality of conversion units, each comprising:
        a capacitor, having a first end and a second end; and
        a second switch, coupled between the inverse-phase input terminal and the conversion units, wherein the conversion units are connected in parallel between the second switch and the output terminal;
    wherein in the first duration each of the capacitors of the conversion units is charged to a corresponding voltage according to corresponding control signals based on a first digital signal, a first inverse digital signal having an inverse phase to the first digital signal, and a corresponding second digital signal, wherein the first digital signal and the second digital signal respectively correspond to polarity and a corresponding bit value of the input digital signal;
    wherein in the second duration, each of the second ends of the capacitors of the conversion units is coupled to the inverse-phase input terminal of the operational amplifier via the second switch, and each of the first ends of the capacitors of the conversion units is coupled to the output terminal of the operational amplifier to generate the analog signal.

2. The digital/analog converter according to claim 1, wherein the first filter and the second filter are capacitors.

3. The digital/analog converter according to claim 1, further comprising a third switch coupled between each of the second ends of the capacitors of the conversion units and the non-inverse-phase input terminal, wherein the third switch is turned on in the first duration such that each of the second ends of the capacitors of the conversion units is coupled to the non-inverse-phase input terminal to receive the reference voltage.

4. The digital/analog converter according to claim 3, wherein each of the conversion units further comprises:
    a first conversion switch, coupled between the output terminal and the first end of the corresponding capacitor, wherein in the second duration the first conversion switches of the conversion units are turned on and the capacitors of the conversion units share charges;
    a second conversion switch, coupled between the first end of the corresponding capacitor and a first voltage;
    a third conversion switch, coupled between the first end of the corresponding capacitor and a second voltage; and
    a fourth conversion switch, coupled between the first end of the corresponding capacitor and the reference voltage, wherein the reference voltage is substantially a mean value of the first voltage and the second voltage;
    wherein in the first duration, in each of the conversion units, one of the second conversion switch, the third conversion switch, and the fourth conversion switch is turned on according to the corresponding control signals;
    wherein in the second duration, in each of the conversion units, the second conversion switch, the third conversion switch, and the fourth conversion switch are turned off and the first conversion switch is turned on 5. The digital/analog converter according to claim 3, wherein each of the conversion unit further comprises:
    a first conversion switch, coupled between the output terminal and the first end of the corresponding capacitor and turned on in the second duration;
    a second conversion switch, coupled between the first end of the corresponding capacitor and a first voltage;
    a third conversion switch, coupled between the first end of the corresponding capacitor and a second voltage, wherein the reference voltage is a mean value of the first voltage and the second voltage;
    a second capacitor, having a first end and a second end, wherein the second end of the second capacitor is coupled to the second end of the corresponding capacitor;
    a fourth conversion switch, coupled between the output terminal and the first end of the second capacitor;
    a fifth conversion switch, coupled between the first end of the corresponding second capacitor and the first voltage; and
    a sixth conversion switch, coupled between the first end of the corresponding second capacitor and the second voltage;
    wherein in the first duration, in each of the conversion units, the second conversion switch, the third conversion switch, the fifth conversion switch, and the sixth conversion switch are selectively turned on according to corresponding control signals;
    wherein in the second duration, in each of the conversion units, the first conversion switch and the fourth conversion switch are turned on and the second conversion switch, the third conversion switch, the fifth conversion switch, and the sixth conversion switch are turned off.

6. The digital/analog converter according to claim 1, wherein each of the conversion units further comprises:
a first conversion switch, coupled between the output terminal and the first end of the corresponding capacitor;
a second conversion switch, coupled between the inverse-phase input terminal and the second switch, wherein the first conversion switch and the second conversion switch are turned on in the second duration;
a third conversion switch, coupled between the first end of the corresponding capacitor and a first voltage;
a fourth conversion switch, coupled between the first end of the corresponding capacitor and a second voltage;
a fifth conversion switch, coupled between the second end of the corresponding capacitor and the first voltage; and
a sixth conversion switch, coupled between the second end of the corresponding capacitor and the second voltage;
wherein in the first duration, in each of the conversion units, the third conversion switch, the fourth conversion switch, the fifth conversion switch and, the sixth conversion switch are selectively turned on according to corresponding control signals so as to charge the capacitor to the corresponding voltage.

7. The digital/analog converter according to claim 6, wherein each of the conversion units further comprises:
a seventh conversion switch, coupled between the first end and the second end of the corresponding capacitor, wherein in each of the conversion units, the seventh conversion switch is selectively turned on in the first duration for charging the capacitor to the corresponding voltage.

8. The digital/analog converter according to claim 6, wherein each of the conversion units further comprises:
a seventh conversion switch, coupled between the first end of the corresponding capacitor and the reference voltage; and
an eighth conversion switch, coupled between the second end of the corresponding capacitor and the reference voltage, wherein in the first duration, in each of the conversion units, the third conversion switch, the fourth conversion switch, the fifth conversion switch, the sixth conversion switch, the seventh conversion switch, and the eighth conversion switch are selectively turned on according to the corresponding control signals so as to charge the capacitor to the corresponding voltage.

9. The digital/analog converter according to claim 1, wherein:
in the first duration, the first switch is turned on and the first filter and the second filter have charge sharing to provide a first filtering operation; and
in the second duration, the first switch is turned off and the capacitors of the conversion units have charge sharing with the first filter to provide a second filtering operation,
wherein a third filtering operation is achieved according to the first filtering operation and the second filtering operation.

10. The digital/analog converter according to claim 9, wherein the first filtering operation and the second filtering operation are of first-order filtering and the third filtering operation is of second-order filtering.

11. A fully-differential digital/analog converter for converting an
input digital signal to an analog signal, comprising:
an operational amplifier, having an inverse-phase output terminal, a non-inverse-phase output terminal, an inverse-phase input terminal, and a non-inverse-phase input terminal, wherein the analog signal is outputted from the inverse-phase output terminal and the non-inverse-phase output terminal;
a first filter, having a first end coupled to the non-inverse-phase output terminal and a second end coupled to the inverse-phase input terminal;
a first switch;
a second filter, having a first end coupled to the non-inverse output terminal via the first switch and a second end coupled to the inverse-phase input terminal;
a plurality of conversion units, each comprising:
a capacitor, having a first end and a second end;
a second switch, coupled between the inverse-phase input terminal and the conversion units, wherein the conversion units are connected in parallel between the second switch and the non-inverse-phase output terminal;
a third filter, having a first end coupled to the inverse-phase output terminal and a second end coupled to the non-inverse-phase input terminal;
a third switch;
a fourth filter, having a first end coupled to the inverse-phase output terminal via the third switch and a second end coupled to the non-inverse-phase input terminal;
a plurality of inverse-phase conversion units, each comprising:
an inverse-phase capacitor, having a first end and a second end; and
a fourth switch, coupled to the non-inverse-phase input terminal and the inverse-phase conversion units, wherein the inverse-phase conversion units are connected in parallel between the second switch and the inverse-phase output terminal;
wherein in a first duration the capacitors of the conversion units and the inverse-phase capacitors of the inverse-phase conversion units each are respectively charged to a corresponding voltage according to corresponding control signals based on a first digital signal, a first inverse digital signal having an inverse phase of the first digital signal, and a corresponding one of second digital signals, wherein the first digital signal and the corresponding one of the second digital signals respectively correspond to polarity and a corresponding bit value of the input digital signal;
wherein in a second duration, each of the second ends of the capacitors of the conversion units is coupled to the inverse-phase input terminal of the operational amplifier via the second switch, and each of the first ends of the capacitors of the conversion units is coupled to the non-inverse-phase output terminal of the operational amplifier, each of the second ends of the inverse-phase capacitors of the inverse-phase conversion units is coupled to the non-inverse-phase input terminal of the operational amplifier via the fourth switch, and each of the first ends of the inverse-phase capacitors of the inverse-phase conversion units is coupled to the inverse-phase output terminal;
wherein in the first duration the first switch and the third switch are turned on, and the second switch and the fourth switch are turned off; and in the second duration the first switch and the third switch are turned off, and the second switch and the fourth switch are turned on.

12. The digital/analog converter according to claim 11, further comprising a fifth switch and a sixth switch, wherein the fifth switch is coupled between each of the second ends of the capacitors of the conversion units and a reference voltage, the sixth switch is coupled between each of the second ends of the inverse-phase capacitors of the inverse-phase conversion units and the reference voltage, and the fifth switch and the sixth switch are turned on in the first duration such that each of the second ends of the capacitors of the conversion units and each of the second ends of the inverse-phase capacitors of the inverse-phase conversion units are coupled to the reference voltage.

13. The digital/analog converter according to claim 12, wherein each of the conversion units further comprises:
- a first conversion switch, coupled between the non-inverse-phase output terminal and the first end of the corresponding capacitor, and turned on in the second duration;
- a second conversion switch, coupled between the first end of the corresponding capacitor and a first voltage;
- a third conversion switch, coupled between the first end of the corresponding capacitor and a second voltage; and
- a fourth conversion switch, coupled between the first end of the corresponding capacitor and the reference voltage, wherein the reference voltage is substantially a mean value of the first voltage and the second voltage;
- wherein in the first duration, in each of the conversion units, one of the second conversion switch, the third conversion switch and the fourth conversion switch is turned on according to the corresponding control signals;
- wherein in the second duration, in each of the conversion units, the second conversion switch, the third conversion switch and the fourth conversion switch are turned off and the first conversion switch is turned on.

14. The digital/analog converter according to claim 12, wherein each of the inverse-phase conversion units further comprises:
- a first conversion switch, coupled between the inverse-phase output terminal and the first end of the corresponding inverse-phase capacitor, and turned on in the second duration;
- a second conversion switch, coupled between the first end of the corresponding inverse-phase capacitor and a first voltage;
- a third conversion switch, coupled between the first end of the corresponding inverse-phase capacitor and a second voltage; and
- a fourth conversion switch, coupled between the first end of the corresponding inverse-phase capacitor and the reference voltage, wherein the reference voltage is substantially a mean value of the first voltage and the second voltage;
- wherein in the first duration, in each of the inverse-phase conversion units, one of the second conversion switch, the third conversion switch and the fourth conversion switch is turned on according to the corresponding control signals;
- wherein in the second duration, in each of the inverse-phase conversion units, the second conversion switch, the third conversion switch and the fourth conversion switch are turned off and the first conversion switch is turned on.

15. The digital/analog converter according to claim 11, wherein:
- in the first duration, when the first switch and the third switch are turned on and the second switch and the fourth switch are turned off,
  - the first filter and the second filter have charge sharing to provide a first filtering operation and the third filter and the fourth filter have charge sharing so as to provide a first filtering operation; and
- in the second duration, when the first switch and the third switch are turned off and the second switch and the fourth switch are turned on,
  - the capacitors of the conversion units have charge sharing with the first filter and the inverse-phase capacitors of the inverse-phase conversion units have charge sharing with the third filter so as to provide a second filtering operation,
- wherein a third filtering operation is achieved according to the first filtering operation and the second filtering operation.

16. The digital/analog converter according to claim 15, wherein the first filtering operation and the second filtering operation are of first-order filtering and the third filtering operation is of second-order filtering.

17. A digital/analog converting apparatus for converting a digital signal to an analog signal, comprising:
- a binary to thermometer code unit, for receiving and converting a first digital signal to a second digital signal;
- a dynamic element matching unit, for reducing the deviation of element-value of the second digital signal and outputting a third digital signal;
- a digital/analog converter, for receiving the third digital signal, the digital/analog converter comprising:
  - an operational amplifier, having an output terminal, an inverse-phase input terminal and a non-inverse-phase input terminal, wherein the non-inverse-phase input terminal is coupled to a reference voltage;
  - a first filter, having a first end coupled to the output terminal and a second end coupled to the inverse-phase input terminal;
  - a first switch;
  - a second filter, having a first end coupled to the output terminal via the first switch and a second end coupled to the inverse-phase input terminal, wherein in a first duration the first switch is turned on and in a second duration the first switch is turned off;
  - a plurality of conversion units, each comprising:
    - a capacitor, having a first end and a second end; and
    - a second switch, coupled between the inverse-phase input terminal and the conversion units, wherein the conversion units are connected in parallel between the second switch and the output terminal, wherein in the first duration the second switch is turned off and in a second duration the second switch is turned on; and
- a low-pass filter;
- wherein in the first duration each of the capacitors of the conversion units is charged to a corresponding voltage according to corresponding control signals based on a fourth digital signal, a first inverse digital signal having an inverse phase to the fourth digital signal, and a corresponding fifth digital signal, wherein the fourth digital signal and the corresponding fifth digital signal respectively correspond to polarity and a corresponding bit value of the third digital signal;
- wherein in the second duration, each of the second ends of the capacitors of the conversion units is coupled to the inverse-phase input terminal of the operational amplifier via the second switch, and each of the first ends of the capacitors of the conversion units is coupled to the output terminal of the operational amplifier to generate the analog signal.

18. The digital/analog converting apparatus according to claim 17, wherein the digital/analog converter further comprises a third switch coupled between each of the second ends of the capacitors of the conversion units and the non-inverse-phase input terminal, and the third switch is turned on in the first duration such that each of the second ends of the capacitors of the conversion units is coupled to the non-inverse-phase input terminal to receive the reference voltage.

19. The digital/analog converting apparatus according to claim 18, wherein each of the conversion units further comprises:
   a first conversion switch, coupled between the output terminal and the first end of the corresponding capacitor, and turned on in the second duration;
   a second conversion switch, coupled to the first end of the corresponding capacitor and a first voltage;
   a third conversion switch, coupled to the first end of the corresponding capacitor and a second voltage, wherein the reference voltage is a mean value of the first voltage and the second voltage;
   a second capacitor, having a first end and a second end, wherein the second end of the second capacitor is coupled to the second end of the corresponding capacitor;
   a fourth conversion switch, coupled between the output terminal and the first end of the second capacitor;
   a fifth conversion switch, coupled between the first end of the corresponding second capacitor and the first voltage; and
   a sixth conversion switch, coupled between the first end of the corresponding second capacitor and the second voltage;
   wherein in the first duration, in each of the conversion units, the second conversion switch, the third conversion switch, the fifth conversion switch and the sixth conversion switch are selectively turned on according to the corresponding control signals;
   wherein in the second duration, in each of the conversion units, the first conversion switch and the fourth conversion switch are turned on and the second conversion switch, the third conversion switch, the fifth conversion switch and the sixth conversion switch are turned off.

20. The digital/analog converting apparatus according to claim 18, wherein each of the conversion units further comprises:
   a first conversion switch, coupled between the output terminal and the first end of the corresponding capacitor, wherein in the second duration the first conversion switches of the conversion units are turned on;
   a second conversion switch, coupled between the first end of the corresponding capacitor and a first voltage;
   a third conversion switch, coupled between the first end of the corresponding capacitor and a second voltage; and
   a fourth conversion switch, coupled between the first end of the corresponding capacitor and the reference voltage, wherein the reference voltage is substantially a mean value of the first voltage and the second voltage;
   wherein in the first duration, in each of the conversion units, one of the second conversion switch, the third conversion switch and the fourth conversion switch of is turned on according to the corresponding control signals;
   wherein in the second duration, in each of the conversion units, the second conversion switch, the third conversion switch and the fourth conversion switch are turned off and the first conversion switch is turned on.

21. The digital/analog converting apparatus according to claim 17, wherein each of the conversion units further comprises:
   a first conversion switch, coupled between the output terminal and the first end of the corresponding capacitor;
   a second conversion switch, coupled between the inverse-phase input terminal and the second switch, wherein the first conversion switch and the second conversion switch are turned on in the second duration;
   a third conversion switch, coupled between the first end of the corresponding capacitor and a first voltage;
   a fourth conversion switch, coupled between the first end of the corresponding capacitor and a second voltage;
   a fifth conversion switch, coupled between the second end of the corresponding capacitor and the first voltage; and
   a sixth conversion switch, coupled between the second end of the corresponding capacitor and the second voltage;
   wherein in the first duration, in each of the conversion units, the third conversion switch, the fourth conversion switch, the fifth conversion switch and the sixth conversion switch are selectively turned on according to the corresponding control signals so as to charge the capacitor to the corresponding voltage.

22. The digital/analog converting apparatus according to claim 21, wherein each of the conversion units further comprises:
   a seventh conversion switch, coupled between the first end of the corresponding capacitor and the reference voltage; and
   an eighth conversion switch, coupled between the second end of the corresponding capacitor and the reference voltage, wherein in the first duration, in each of the conversion units, the third conversion switch, the fourth conversion switch, the fifth conversion switch, the sixth conversion switch, the seventh conversion switch and the eighth conversion switch are selectively turned on according to the corresponding control signals so as to charge the capacitor to the corresponding voltage.

23. The digital/analog converting apparatus according to claim 21, wherein each of the conversion units further comprises:
   a seventh conversion switch, coupled between the first end and the second end of the corresponding capacitor, wherein in each of the conversion units, the seventh conversion switch is selectively turned on in the first duration for charging the capacitor to the corresponding voltage.

24. The digital/analog converting apparatus according to claim 17, wherein:
   in the first duration, the first switch is turned on and the first filter and the second filter have charge sharing to provide a first filtering operation; and
   in the second duration, the first switch is turned off and the capacitors of the conversion units have charge sharing with the first filter to provide a second filtering operation,
   wherein a third filtering operation is achieved according to the first filtering operation and the second filtering operation.

25. The digital/analog converting apparatus according to claim 24, wherein the first filtering operation and the second filtering operation are of first-order filtering and the third filtering operation is of second-order filtering.

* * * * *